United States Patent
Shimizu et al.

(10) Patent No.: US 7,116,175 B2
(45) Date of Patent: Oct. 3, 2006

(54) SEMICONDUCTOR DEVICE

(75) Inventors: Toshihiko Shimizu, Tokorozawa (JP); Yoshikuni Matsunaga, Niiza (JP); Yuri Kusakari, Kawasaki (JP)

(73) Assignee: Renesas Technology Corp., Tokyo (JP)

( * ) Notice: Subject to any disclaimer, the term of this patent is extended or adjusted under 35 U.S.C. 154(b) by 120 days.

(21) Appl. No.: 10/890,281

(22) Filed: Jul. 14, 2004

(65) Prior Publication Data
US 2005/0030107 A1 Feb. 10, 2005

(30) Foreign Application Priority Data
Aug. 8, 2003 (JP) ............................. 2003-290136

(51) Int. Cl.
*H03F 3/14* (2006.01)
(52) U.S. Cl. ..................... 330/307; 330/126; 330/310
(58) Field of Classification Search ................ 330/307, 330/126, 310
See application file for complete search history.

(56) References Cited

U.S. PATENT DOCUMENTS 6,297,694 B1 10/2001 Yamamoto
6,329,879 B1 * 12/2001 Maruyama et al. ......... 330/289
6,330,165 B1 * 12/2001 Kohjiro et al. ............. 361/760
6,483,398 B1 * 11/2002 Nagamori et al. .......... 333/116
6,489,680 B1 * 12/2002 Kohjiro et al. ............. 257/728
6,605,842 B1 * 8/2003 Hoshino et al. ............ 257/339
6,765,268 B1 * 7/2004 Akamine et al. ........... 257/368

FOREIGN PATENT DOCUMENTS

JP 2000-332551 5/1999
JP 2001-141756 11/1999
JP 2001-345400 6/2000

* cited by examiner

*Primary Examiner*—Patricia Nguyen
(74) *Attorney, Agent, or Firm*—Reed Smith LLP; Stanley P. Fisher, Esq.; Juan Carlos A. Marquez, Esq.

(57) ABSTRACT

Power amplifier circuits which constitute an RF power module used for a digital device capable of handling high frequency signals in two frequency bands are disposed over the same IC chip. The power amplifier circuits are disposed around the IC chip, and a secondary circuit is disposed between the power amplifier circuits. Thus, the power amplifier circuits are provided within the same IC chip to enable a size reduction. Further, the distance between the power amplifier circuits is ensured even if the power amplifier circuits are provided within the same IC chip. It is therefore possible to suppress the coupling between the power amplifier circuits and restrain crosstalk between the power amplifier circuits.

10 Claims, 12 Drawing Sheets

SEMICONDUCTOR DEVICE

CROSS-REFERENCE TO RELATED APPLICATION

The present application claims priority to Japanese Patent application JP 2003-290136 filed on Aug. 8, 2003, the content of which is hereby incorporated by reference in its entirety herein.

FIELD OF THE INVENTION

The present invention relates to a semiconductor device and method, and, more particularly, to a device, system, and method for an RF (Radio Frequency) power module.

BACKGROUND OF THE INVENTION

An RF power module is a signal amplifying electronic component used in a communication device such as, for example, a cellular phone, or the like. The RF power module is assembled by packaging semiconductor chips, each having signal amplifying transistors, chip parts, and the like, over a module board. The respective semiconductor chips and the module board are electrically connected to one another through bonding wires. Also, the chip parts can be electrically connected to the module board by connecting their terminals to pads of the module board by soldering.

Such a configuration with a bias circuit and a bias switch circuit employed in high frequency power amplifiers for a dual band system constructed of HBTs (Heterojunction Bipolar Transistors), has been disclosed in Japanese Patent Laid-Open No. 2000-332551.

Further, such a configuration that, in high frequency parts or components for a dual band system, includes a plurality of GND lines provided between output microstrip lines to prevent interference between two outputs has been disclosed in, for example, Japanese Patent Laid-Open No. 2001-141756.

Furthermore, a technique for providing ground pads between output pads of both a semiconductor chip and a wiring board to prevent interference between two outputs in a power module for a dual band, and for wire-bonding, has been disclosed in, for example, Japanese Patent Laid-Open No. 2001-345400.

SUMMARY OF THE INVENTION

The miniaturization of the RF power module has been provided herein. An important problem exists in how to miniaturize the RF power module without causing degradation of characteristics like reliability, performance, etc.

The present invention may provide a technique for decreasing the size of a semiconductor device.

The present invention may provide a semiconductor device wherein all of a plurality of stages of amplifier circuits of high frequency power amplifier circuits may be respectively formed of horizontal type field effect transistors and may be provided over the same semiconductor chip having a silicon semiconductor substrate.

Since all of a plurality of stages of amplifier circuits of high frequency power amplifier circuits may be respectively formed of horizontal type field effect transistors and may be provided over the same semiconductor chip having a silicon semiconductor substrate, a semiconductor device may be reduced in size.

BRIEF DESCRIPTION OF THE DRAWINGS

Understanding of the present invention will be facilitated by consideration of the following detailed description of the preferred embodiments of the present invention taken in conjunction with the accompanying drawings, in which like numerals refer to like parts, and wherein.

DETAILED DESCRIPTION

It is to be understood that the figures and descriptions of the present invention have been simplified to illustrate elements that are relevant for a clear understanding of the present invention, while eliminating, for the purpose of clarity, many other elements found in typical semiconductor devices, systems and methods. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Prior to the detailed description of embodiments of the present invention, the meaning of certain terms employed in embodiments discussed hereinbelow is explained as follows:

1. GSM (Global System for Mobile Communication) may indicate one wireless communication system or standard used in a digital cellular phone. GSM may include three frequency bands of a radio wave, such as a 900 MHz band called "GSM900" or simply "GSM", a 1800 MHz band called "GSM1800" or "DCS1800" (Digital Cellular System) or PCN, and 1900 MHz band called "GSM1900", "DCS1900", or "PCS" (Personal Communication Services). Incidentally, GSM1900 may be principally used in North America. In addition, GSM850, corresponding to an 850 MHz band, might also be used in North America.

2. A GMSK (Gaussian filtered Minimum Shift Keying) modulation system or scheme may be a system used in communications of audible or voice signals, i.e., a system that phase-shifts the phase of a carrier according to transmit data. An EDGE modulation system or scheme may be a system used in data communications, i.e., a system in which an amplitude shift may be further added to a phase shift of GMSK modulation.

3. A MOSFET (Metal Oxide Semiconductor Field Effect Transistor), corresponding to a field effect transistor, may be abbreviated as "MOS", and an n channel type MOS may be abbreviated as "nMOS".

In an exemplary embodiment of the present invention, a semiconductor device may be applied to an RF (Radio Frequency) power module used in a digital cellular phone for transmitting information by using, for example, a network of a GMS system.

Figure 1:
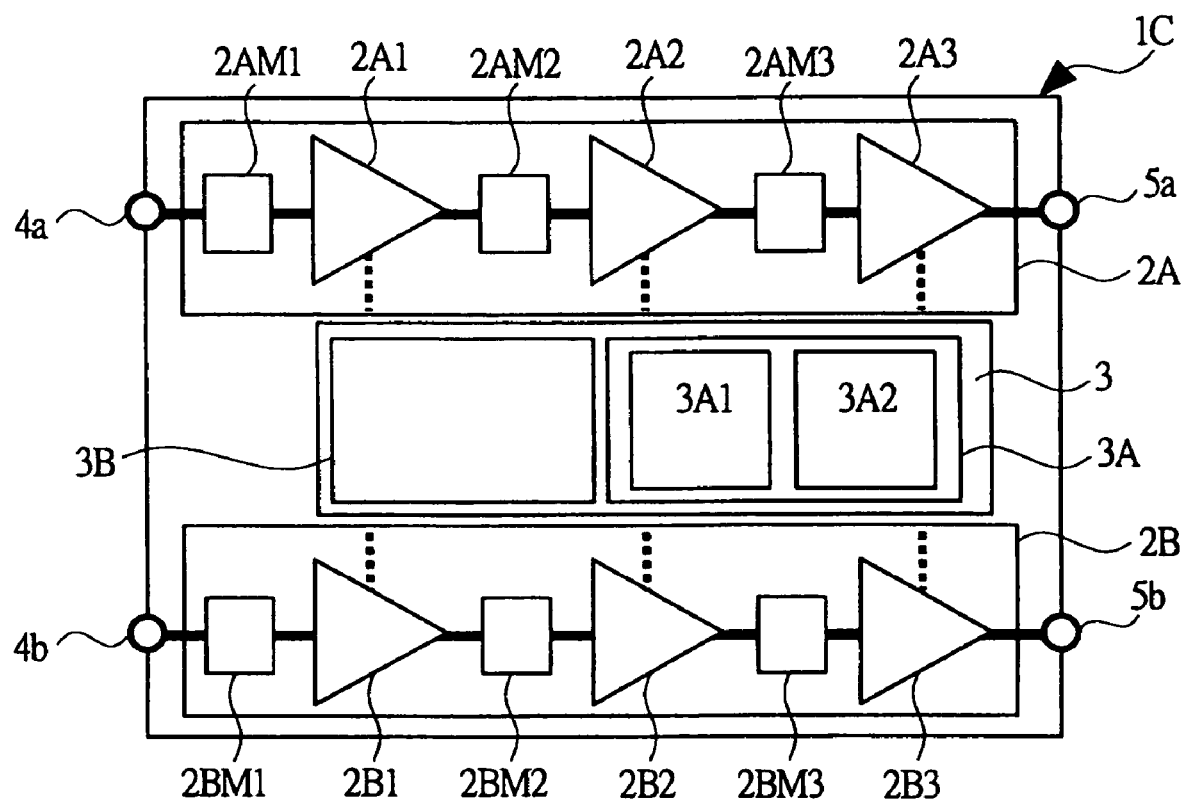
FIG. 1 is a circuit block diagram showing a semiconductor device according to an exemplary embodiment of the present invention.

As shown in FIG. 1, a circuit block diagram of an IC (integrated circuit) chip (or semiconductor chip) 1C for amplifier circuits, which may constitute an RF power module according to the present embodiment, is illustrated. A circuit block of an 1C chip (semiconductor chip) 1C for amplifier circuits, which may be used in the RF power module capable of using two frequency bands (dual band system) of, for example, GSM900 and DCS1800, and using two communication systems of the GMSK modulation system and the EDGE (Enhanced Data GSM Environment) modulation system at their frequency bands, is illustrated in FIG. 1.

The IC chip 1C may include a power amplifier circuit 2A for GSM900, a power amplifier circuit 2B for DCS1800, and a peripheral circuit 3 which may effect control, compensation and the like on amplifying operations of the those power amplifier circuits 2A and 2B. The power amplifier circuits 2A and 2B respectively may have three amplifying stages 2A1 through 2A3 and 2B1 through 2B3 and three matching circuits 2AM1 through 2AM3 and 2BM1 through 2BM3. That is, input terminals 4a and 4b of the IC chip 1C may be electrically connected to their corresponding inputs of the amplifying stages 2A1 and 2B1, each corresponding to a first stage via the input matching circuits 2AM1 and 2BM1. The outputs of the amplifying stages 2A1 and 2B1, each corresponding to the first stage, may be electrically connected to their corresponding inputs of the amplifying stages 2A2 and 2B2, each corresponding to a second stage via the inter-stage matching circuits 2AM2 and 2BM2. The outputs of the amplifying stages 2A2 and 2B2 may be electrically connected to their corresponding inputs of the final-stage amplifying stages 2A3 and 2B3 via the inter-stage matching circuits 2AM3 and 2BM3. The outputs of the final-stage amplifying stages 2A3 and 2B3 may be electrically connected to their corresponding output terminals 5a and 5b. Thus, in the present exemplary embodiment, all the amplifying stages 2A1 through 2A3 and 2B1 through 2B3 of the power amplifier circuits 2A and 2B may be provided in one IC chip 1C. In general, three amplifying stages may be respectively provided in discrete IC chips, or the amplifying stages corresponding to the first and second stages may be provided in one IC chip and the final-stage amplifying stage may be provided in an IC chip different from the IC chip provided with the first-stage and second-stage amplifying stages, because, for example, the power of the final-stage amplifying stage may be high and generated heat may increase upon its operation, and thus signal interference with other amplifying stages may also increase. Therefore, miniaturization of the RF power module may be impaired. On the other hand, since all the amplifying stages 2A1 through 2A3 and 2B1 through 2B3 of the power amplifying states 2A and 2B may be provided in one IC chip 1C in the present exemplary embodiment, the adjacent intervals among the respective amplifying stages 2A1 through 2A3 and 2B1 through 2B3 may be greatly shortened. It may therefore be possible to realize substantial miniaturization of the RF power module with the IC chip 1C built therein.

The peripheral circuit 3 may include a control circuit 3A, and a bias circuit 3B, which may apply a bias voltage to each of the amplifying stages 2A1 through 2A3 and 2B1 through 2B3, etc. The control circuit 3A may be a circuit which may generate a desired voltage to be applied to each of the power amplifier circuits 2A and 2B and may include a power supply control circuit 3A1 and a bias voltage generating circuit 3A2. The power supply control circuit 3A1 may be a circuit which generates a first power supply voltage applied to each of drain terminals of output power MOSs of the amplifying stages 2A1 through 2A3 and 2B1 through 2B3. Also, the bias voltage generating circuit 3A2 may be a circuit which may generate a first control voltage for controlling the bias circuit 3B. The present exemplary embodiment may be configured in such a manner that when the power supply control circuit 3A1 generates the first power supply voltage, based on an output level designation signal supplied from a baseband circuit provided outside the IC chip 1C, the bias voltage generating circuit 3A2 may generate the first control voltage, based on the first power supply voltage generated by the power supply control circuit 3A1. The baseband circuit may be a circuit which generates the output level designation signal. The output level designation signal may be a signal for designating or specifying output levels of the power amplifier circuits 2A and 2B and may be generated based on the distance between a cellular phone and a base station, i.e., an output level corresponding to the intensity of a radio wave. In the present exemplary embodiment, elements constitutive of such a peripheral circuit 3 may also be provided in one IC chip 1C. Thus, interface units (interface unit between IC chip 1C and module board (wiring board) and interface units, respectively, necessary for IC chip 1C and module board) may be greatly cut down, and the IC chip 1C and the module board may be reduced in area. It may therefore be possible to realize substantial miniaturization of the RF power module.

Figure 2:
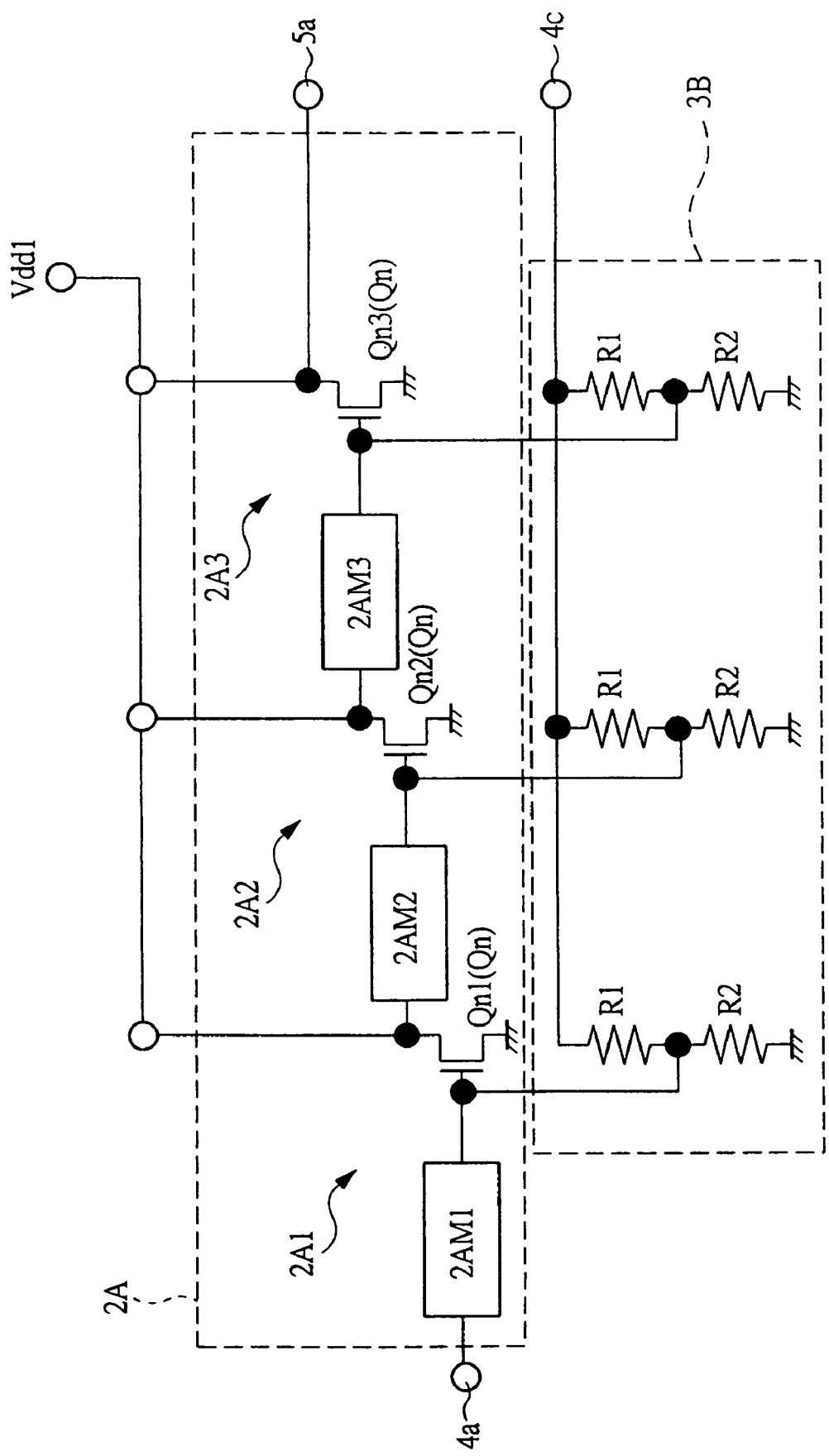
FIG. 2 is a fragmentary circuit diagram illustrating the semiconductor device shown in FIG. 1.

As seen in FIG. 2, an example illustrative of circuit configurations of the power amplifier circuit 2A and the bias circuit 3B is shown. Incidentally, since the power amplifier circuits 2A and 2B and their bias circuit 3B may be identical in circuit configuration, the power amplifier circuit 2A and an example of the circuit configuration for the power amplifier circuit 2A may be shown as representative of the present embodiment.

The power amplifier circuit 2A according to the present embodiment 1 may have a circuit configuration wherein three nMOSQn (Qn1, Qn2 and Qn3) may be sequentially connected in tandem as the three-stage amplifying stages 2A1 through 2A3. The output level of the power amplifier circuit 2A may be controlled by the bias circuit 3B and the first power supply voltage Vdd1 supplied from the power supply circuit 3A1. In the present embodiment, the first power supply voltage Vdd1 may be supplied to the respective drain electrodes of the three nMOSQn1, Qn2 and Qn3.

Each of the matching circuits 2AM1 through 2AM3 may have an inductor (passive element) and a capacitor (passive element). The inductor may be formed of a wiring and may have the function of impedance-matching between the input of the amplifying stage 2A1 (nMOSQn1), corresponding to the first stage, and each of the respective interstages. The capacitor may be connected between the inductor and each of the inputs of the nMOSQn of the respective stages and may additionally have the functions of the impedance matching, and that of shutting off dc voltages of the first power supply voltage Vdd1 and a gate bias voltage.

The bias circuit 3B may have a plurality of voltage division circuits. Each of the voltage division circuits may include a pair of resistors R1 and R2. Each pair of resistors R1 and R2 may be connected in series between an input terminal 4c of the bias circuit 3B and a reference potential (e.g., ground potential: 0V). Wiring portions that connect among the respective pairs of resistors R1 and R2 and the inputs (gate electrodes) of the nMOSQn1 through Qn3 of the respective stages may be electrically connected to one another, respectively. When the first control voltage or output level control voltage is inputted to the input terminal 4c of the bias circuit 3B, the voltage may be divided by each pair of resistors R1 and R2 to thereby generate a desired gate bias voltage, which in turn may be inputted to each of the gate electrodes of the respective nMOSQn1 through Qn3.

Figure 3:
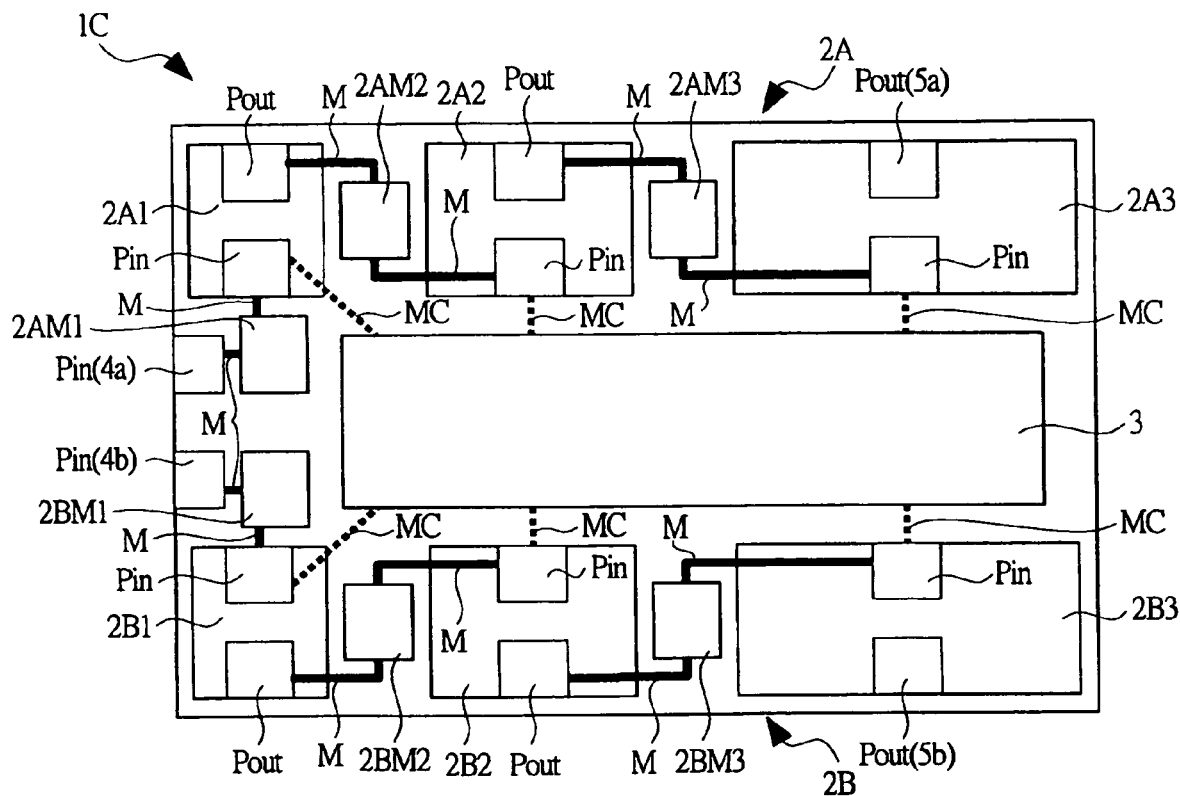
FIG. 3 is an overall plan view of a semiconductor chip, showing a circuit layout example of the semiconductor device shown in FIG. 1.
Figure 4:
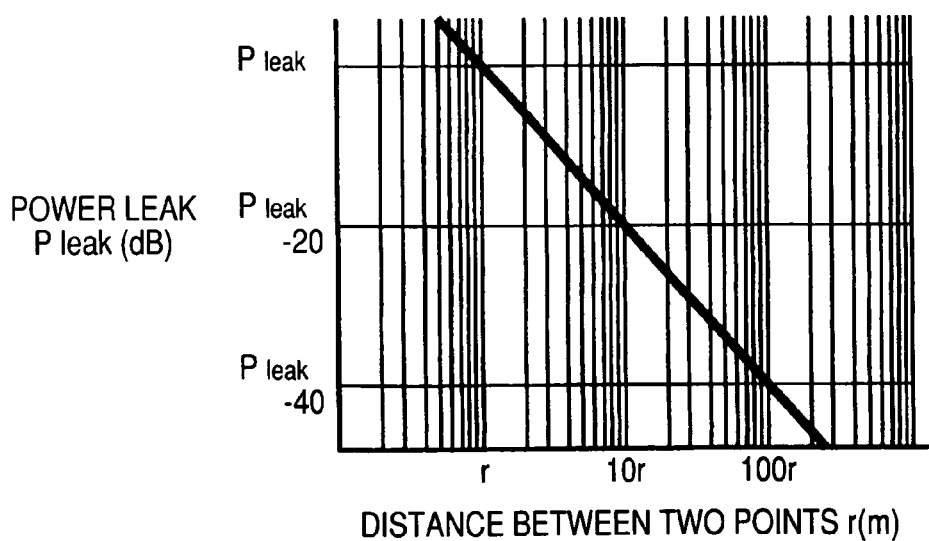
FIG. 4 is a graph diagram depicting the relationship between a distance and a power leak.

As seen in FIG. 3, an example of a circuit layout of the IC chip 1C for the amplifier circuits, which is shown in FIG. 1, is shown. Additionally, FIG. 4 shows a graph diagram illustrating the relationship between a distance and a power leak, respectively.

In the present exemplary embodiment as is shown in FIG. 3, the power amplifier circuits 2A and 2B may be disposed around a main surface (device forming surface) of the IC chip 1C, and the peripheral circuit 3 may be disposed between the respective power amplifier circuits 2A and 2B. Since the final-stage amplifying stages 2A3 and 2B3 of the power amplifier circuits 2A and 2B may be high in power, an increase in heat generated upon their operation may cause an increase in signal interference with other amplifying stages. Problems with interference between signals may be large because the phases of respective higher harmonics may be inverse, such as in the case where high frequency signals to be treated may be 900 MHz and 1800 MHz, respectively. As described above, the final-stage amplifying stages 2A3 and 2B3 may be disposed in the vicinity of opposed sides of the IC chip 1C, such that the distance therebetween may become long. Since the amount of propagation of a signal between two points may be inversely proportional substantially to the square of the distance, as shown in FIG. 4, the power amplifier circuits 2A and 2B may be disposed away from each other as described above, whereby crosstalk (radiation or interference) between the power amplifier circuit in operation and the power amplifier circuit in non-operation, for example, may be suppressed. Further, the occurrence of an unnecessary output from the power amplifier circuit being in non-operation may be suppressed. Even if the power amplifier circuits 2A and 2B, which may be different in a system, are provided in the same IC chip 1C, the crossband isolation characteristic between the power amplifier circuits 2A and 2B may be improved. It may thus be possible to enhance reliability and stability of the operation of the RF power module.

Signs Pin in FIG. 3 may indicate input bonding pads and signs Pout may indicate output bonding pads, respectively. The bonding pads Pin of the respective amplifying stages 2A1 through 2A3 and amplifying stages 2B1 through 2B3 may be placed over the central side of the IC chip 1C, whereas the bonding pads Pout of the respective amplifying stages 2A1 through 2A3 and the amplifying stages 2B1 through 2B3 may be disposed on the sides of the IC chip 1C. Signs M may indicate input, output and amplifying interstage wirings, respectively. The amplifying interstage wirings M may connect between the bonding pads Pin and Pout in bent states. Further, signs M may indicate wirings which connect the amplifying stages 2A1 through 2A3 and 2B1 through 2B3 and the peripheral circuit 3.

Figure 5:
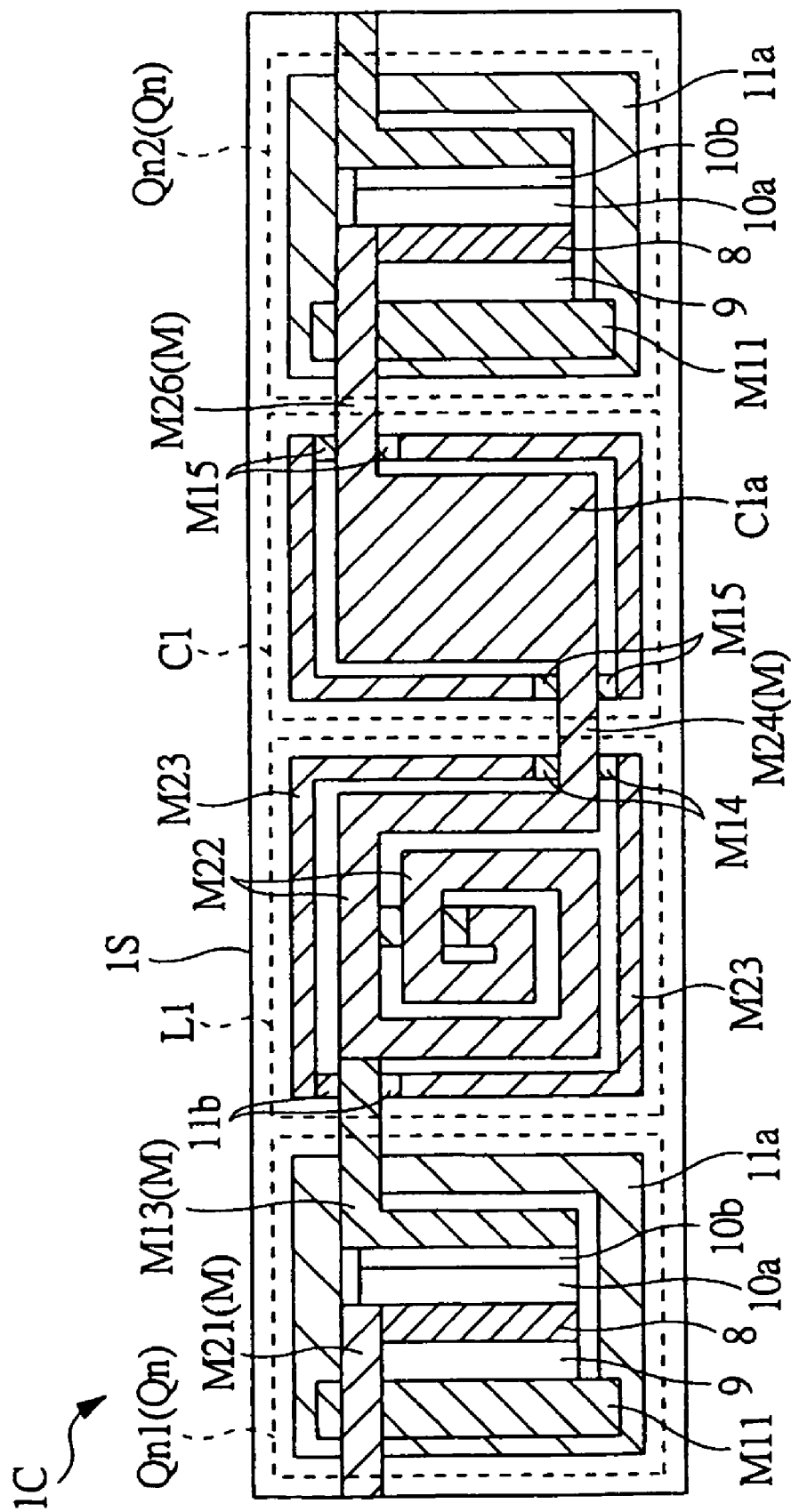
FIG. 5 is a fragmentary plan view showing the semiconductor chip of the semiconductor device shown in FIG. 1.
Figure 6:
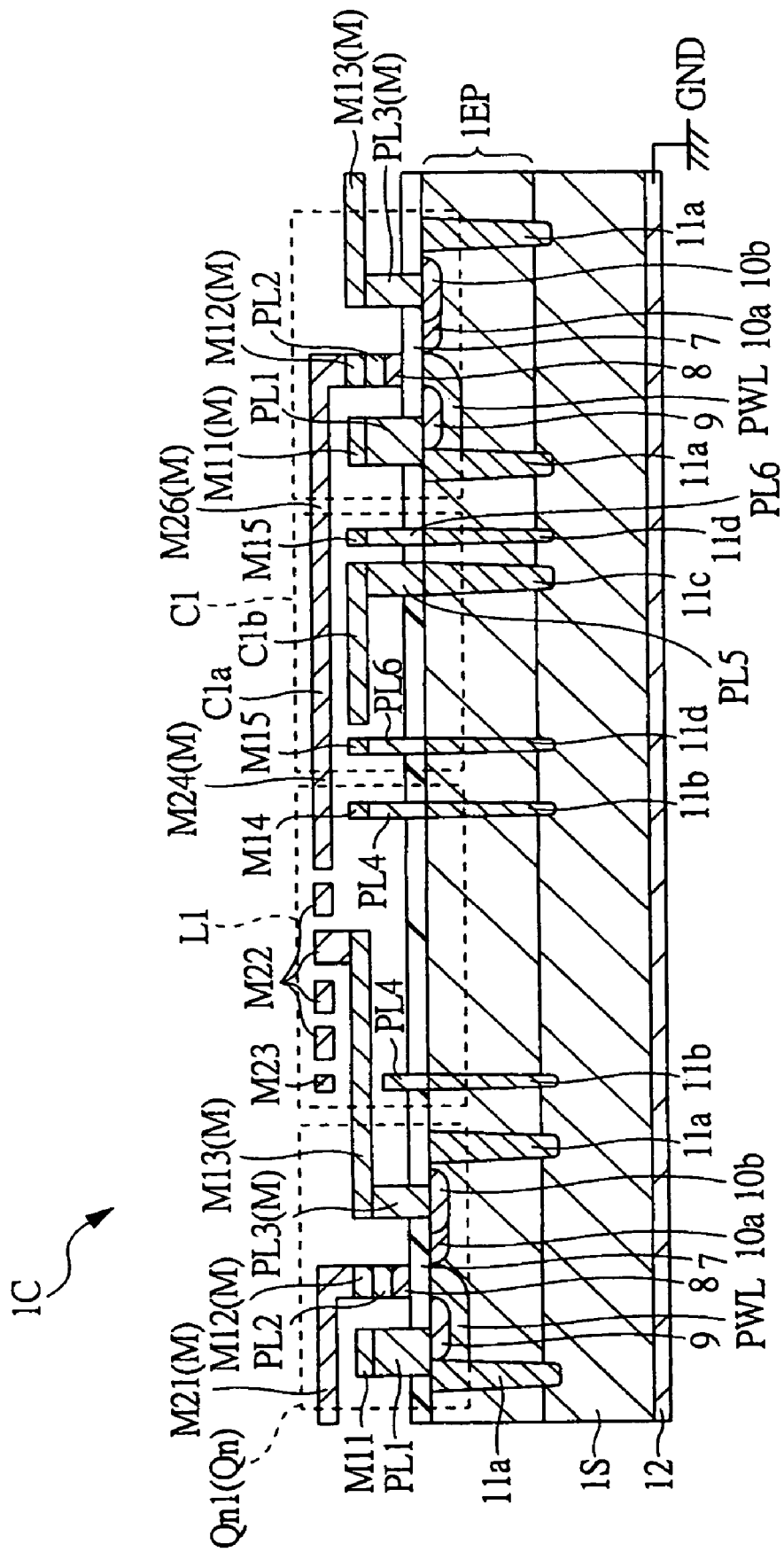
FIG. 6 is a fragmentary cross-sectional view illustrating the semiconductor chip shown in FIG. 5.

As seen in FIG. 5, a fragmentary plan view of the IC chip 1C is shown. Additionally, FIG. 6 shows a fragmentary crosssectional view of a spot cut along the horizontal direction of the CI chip 1C shown in FIG. 5. Incidentally, although FIG. 5 is a plan view, the same hatching may be applied to ones lying in the same layer.

A semiconductor substrate (hereinafter also "substrate") 1S, constituting the IC chip 1C, may include, for example, a $p^+$ type silicon (Si) monocrystal and may be configured as a low resistance substrate whose resistivity ranges from, for example, approximately 1 to 10 mΩ·cm. An epitaxial layer 1EP comprising, for example, a $p^-$ type silicon monocrystal may be formed over the substrate 1S. The resistivity of the epitaxial layer 1EP may be higher than that of the substrate 1S. Over a main surface of the epitaxial layer 1EP, nMOSQn for the amplifying stages 2A1 through 2A3 and 2B1 through 2B3, and inductors L1, capacitors C1 each having a high Q (Quality factor) value and strip lines for the matching circuits 2AM1 though 2AM3 and 2BM1 through 2BM3, may be formed. Although the nMOSQn1 and Qn2 of the two amplifying stages are illustrated in the present embodiment, the amplifying stages 2A1 through 2A3 and 2B1 through 2B3 of all of the first through three stages may be formed over the same substrate 1S as described above. The nMOSQn shown here indicate unit MOSs. In practice, a plurality of the unit MOSs may be connected in parallel to form the respective one of the amplifying stages 2A1 through 2A3 and 2B1 through 2B3.

First, the nMOSQn may be formed of a horizontal type MOS like, for example, an LDMOS (Laterally Diffuses MOS), or the like. A type well PWL may be formed in the epitaxial layer 1EP, corresponding to a region for forming each nMOSQn. The p type well PWL may be formed by ion-implanting an impurity, such as boron (B), into the epitaxial layer 1EP. A gate insulating film 7 for each nMOSQn may be formed over the p type well PWL of the epitaxial layer 1E P. The gate insulating film 7 may be formed of, for example, silicon oxide ($SiO_2$), or the like, and may further be formed by, for example, a thermal oxidation method, or the like. A gate electrode (input) 8 for each nMOSQn may be formed over the gate insulating film 7. The gate electrode 8 may include a laminated conductor film of, for example, polycrystalline silicon, and a metal silicide layer (e.g., titanium silicide layer or cobalt silicide layer) formed thereon. A channel for each nMOSQn may be formed above the p type well PWL located below the gate electrode 8.

An $n^+$ type semiconductor region 9 may be formed within a region for the p type well PWL, which may be located in the vicinity of one end of each gate electrode 8. The $n^+$ type semiconductor region 9 may be a region which functions as the source of the nMOSQn and may be formed by ion-implanting an impurity, such as phosphorous (P), into the p type well PWL. An n type semiconductor region 10a may be formed in the epitaxial layer 1EP in the vicinity of the other end of the gate electrode 8. Then, an $n^+$ type semiconductor region 10b may be formed at a spot spaced by the $n^-$ type semiconductor region 10a from the other end of the gate electrode 8, being electrically connected to the $n^-$ type semiconductor region 10a (LDD (Lightly Doped Drain) structure). The $n^-$ type semiconductor region 10a and the $n^+$ type semiconductor region 10b may be regions which function as the drains (outputs) of the nMOSQn and may be formed by ion-implanting an impurity, such as phosphorous (P), into the corresponding p type well PWL.

In the present exemplary embodiment, $p^{++}$ type semiconductor regions 11a may be formed in the epitaxial layer 1EP for the region for forming each nMOSQn so as to make contact with the $n^+$ type semiconductor regions 9 and 10. The $p^{++}$ type semiconductor regions 11a may be provided by introducing, for example, boron (B), and may be formed so as to surround each nMOSQn as viewed in its plane and formed so as to extend from the main surface of the epitaxial layer 1EP to the substrate 1S, as viewed in its section. In the present embodiment, the $n^+$ type semiconductor region 9 for the source of each nMOSQn may be electrically connected to its corresponding $p^{++}$ type semiconductor region 11a through a plug PL1 and electrically connected to the low resistance $p^+$ type substrate 1S through the $p^{++}$ type semiconductor region 11a. As will be described later, the substrate 1S may be electrically connected to wirings of a module board with the IC chip 1C packaged thereon, through an electrode 12 formed over the whole back surface of the substrate 1S and electrically connected to a reference potential (e.g., ground potential GND, that is 0V: fixed potential) through the wirings. That is, the substrate 1S may be used as a ground portion common to the plurality of nMOSQn formed in the IC chip 1C.

Figure 7:
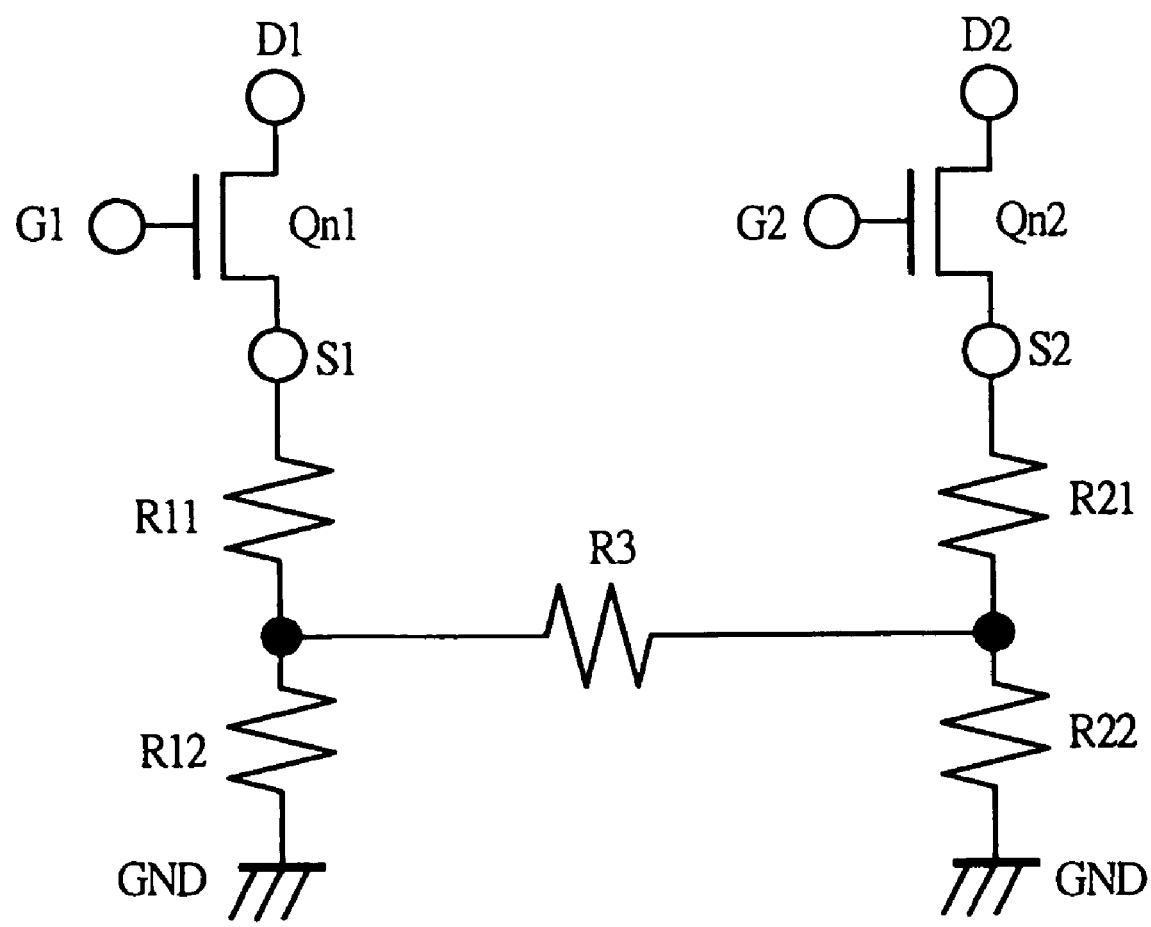
FIG. 7 is a circuit diagram showing an equivalent circuit of an amplifying stage of the semiconductor chip shown in FIG. 5.

An equivalent circuit illustrative of this is seen in FIG. 7, where nMOSQn1 and Qn2 of two amplifying stages 2A1 and 2A2 (or amplifying stages 2B1 and 2B2) of the same power amplifier circuit 2A (or power amplifier circuit 2B) are shown. Signs G1 and G2 may indicate gate electrodes 8 of the MOSQn1 and Qn2. Since sources S1 and S2 (each corresponding to the $n^+$ type semiconductor region 9) of the two nMOSQn1 and Qn2 may be electrically connected to a ground potential GND via the $p^{++}$ type semiconductor regions 11a and the $p^+$ type substrate 1S, the power amplifier circuit may have resistive components R11 and R21 of the $p^{++}$ type semiconductor regions 11a and resistive components R12, R22 and R3 of the $p^+$ type substrate 1S. Since the resistivity of a substrate for the normal CMOS·LSI (Complementary MOS·Large Scale Integrated circuit) may be high, such as multiples of 10 Ωcm, the resistive components R11, R21, R12, R22 and R3 may become high if such a configuration as described in the present embodiment 1 is taken, and signal gain of the source S1 of the nMOSQn1 with respect to the source S2 of the nMOSQn2 may be produced. Therefore, interference may occur between the nMOSQn1 and Qn2, oscillations and a gain reduction may occur, resulting in degradation of input/output isolation. On the other hand, since the resistance of the substrate 1S may be low in the present embodiment, the resistive components R21, R22 and R3 may be brought close to zero (0). In other words, the sources S1 and S2 of the two nMOSQn1 and Qn2 may become equivalent to the fact that they are both directly connected to a stable ground. It may therefore be possible to avoid occurrence of interference between connected elements in the substrate 1S. For example, crosstalk between each of nMOSQn3 of the final-stage amplifying stages 2A3 and 2B3 and each of the amplifying stages 2A1, 2A2, 2B1 and 2B2 corresponding to the first and second stages and the peripheral circuit 3 may be reduced. That is, since the characteristics of isolation among the nMOSQn1 through Qn3 of the respective amplifying stages 2A1 through 2A3 and 2B1 through 2B3 may be improved, oscillations may be suppressed and the stability of amplifying characteristics of the nMOSQn1 through Qn3 may be enhanced. This means that similar isolation characteristics may be obtained not only among the amplifying stages 2A1 through 2A3 and 2B1 through 2B3 but also among other circuit elements, and crosstalk between the circuit elements may be reduced.

Included in the present invention are connections among the nMOSQn1 and Qn2, inductors L1 and capacitors C1, as shown in FIGS. 5 and 6. The plug PL1 connected to the $n^+$ type semiconductor region 9 for the source of the pre-stage nMOSQn1 may be electrically connected to its corresponding first layer wiring M11. The gate electrode 8 of the nMOSQn1 may be electrically connected to its corresponding second layer wiring M21 (M) via a plug PL2 and a first layer wiring M12 (M). The second layer wiring M21 may be a wiring for the input of the nMOSQn1. The $n^+$ type semiconductor region 11 for the drain of the nMOSQn1 may be electrically connected to its corresponding first layer wiring M13 (M) via a plug PL3. The first layer wiring M13 may be electrically connected to one end of its corresponding inductor L1.

The inductor L1 may be formed of, for example, a spiral second layer wiring M22 The outer periphery of the inductor L1 may be surrounded by a first layer wiring M14, a second layer wiring M23, plugs PL4 and $p^{++}$ type semiconductor regions 11b for shielding. The first layer wiring M14, the second layer wiring M23, the plugs PL4 and the $p^{++}$ type semiconductor regions 11b may be electrically connected to one another (insulated from the inductor L1). Further, they may be electrically connected to the low resistance substrate 1S via the $p^{++}$ type semiconductor regions 11b and may be set to the ground potential GND. Thus, it may be possible to suppress or prevent leakage of a magnetic field developed in the inductor L1 into the outside. Since the coupling between the inductor L1 and each nMOSQn, or the like, provided may be suppressed or prevented, the influence of external crosstalk may be suppressed or prevented. The other end of the inductor L1 may be electrically connected to its corresponding upper electrode C1a of the capacitor C1 via a second layer wiring M24 (M).

A lower electrode C1b may be provided in a wiring layer below the upper electrode C1a of the capacitor C1 so as to be opposite to the upper electrode C1a with an insulating film interposed therebetween. The lower electrode C1b may be electrically connected to its corresponding $p^+$ semiconductor region 11c via a plug PL5. Further, the lower electrode C1b may be electrically connected to the low resistance $p^+$ type substrate 1S via the $p^+$ type semiconductor region 11c. The outer periphery of the capacitor C1 may also be surrounded by a first layer wiring M15, second layer wiring M25, plugs PL6 and $p^{++}$ type semiconductor regions 11*d* for shielding. The first layer wiring M15, the second layer wiring M25, the plugs PL6 and the $p^{++}$ type semiconductor regions 11*d* for the shielding may be electrically connected to one another (insulated from the capacitor C1). Further, they may be electrically connected to the low resistance substrate 1S via the $p^{++}$ type semiconductor regions 11*d* and may be set to the ground potential GND. Thus, since the coupling between the capacitor C1 and each nMOSQn or the like provided there outside may be suppressed or prevented, the influence of external crosstalk may be suppressed or prevented. Accordingly, the Q value of the capacitor C1 placed over the substrate 1S may be set high. The upper electrode C1*a* of the capacitor C1 may be electrically connected to its corresponding gate electrode 8 of the nMOSQn2 via a second layer wiring M26 (M). Incidentally, the plugs PL1 through PL6 may be respectively formed of a metal, such as tungsten, or the like. Also, the fist layer wirings M11 through M15 and the second layer wirings M21 through M26 may be respectively formed of a metal with, for example, aluminum (Al) or copper (Cu), as a main wiring material. The $p^{++}$ type semiconductor regions 11*b* through 11*d* may be formed simultaneously upon the process of forming the $p^{++}$ type semiconductor regions 11*a*.

Figure 8:
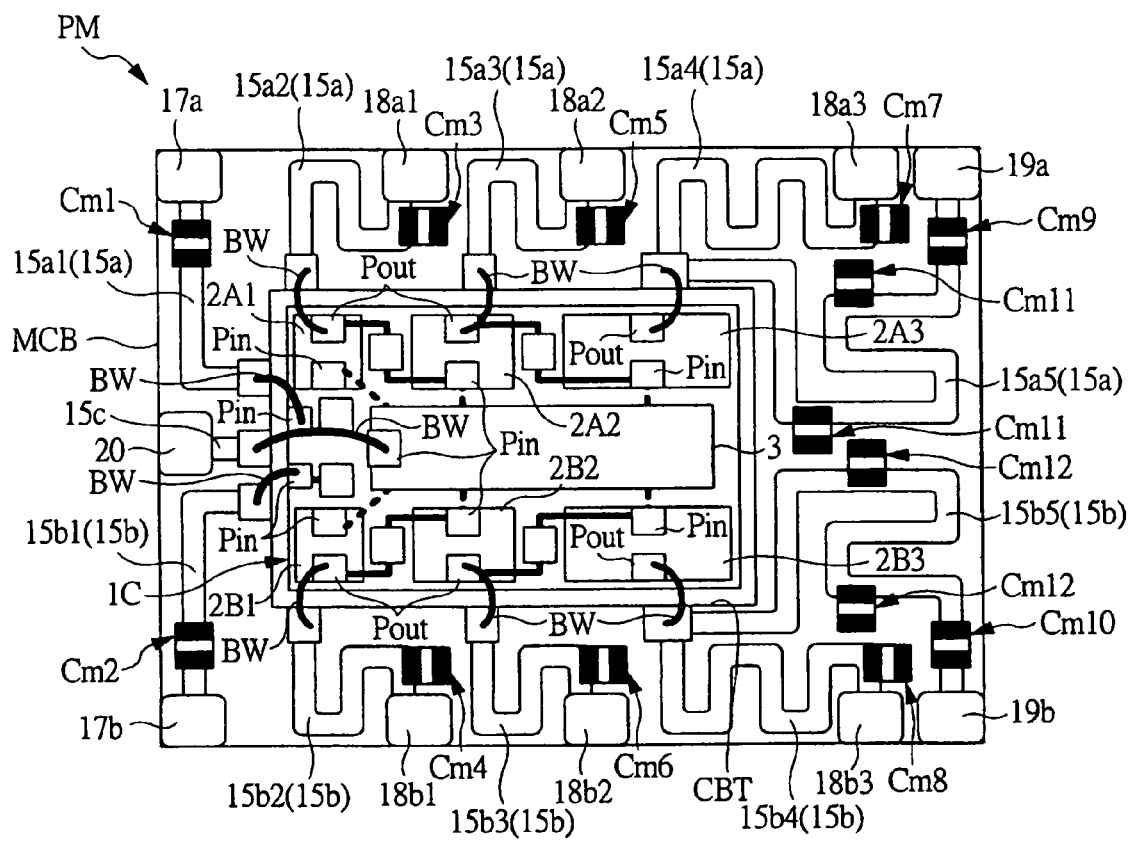
FIG. 8 is an overall plan view illustrating one example of an RF power module in which the semiconductor chip shown in FIG. 5 is mounted on a module board.
Figure 9:
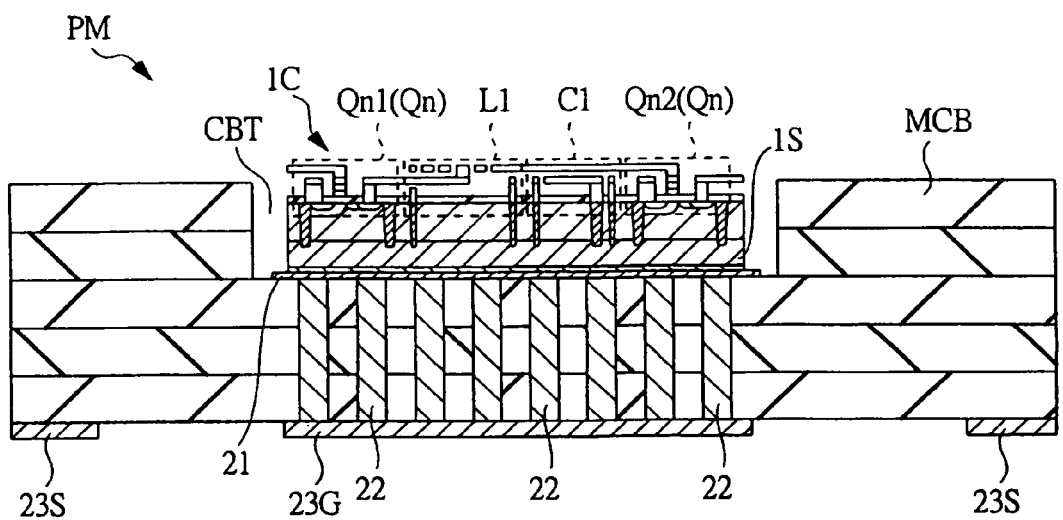
FIG. 9 is a cross-sectional view showing the RF power module shown in FIG. 8.
Figure 10:
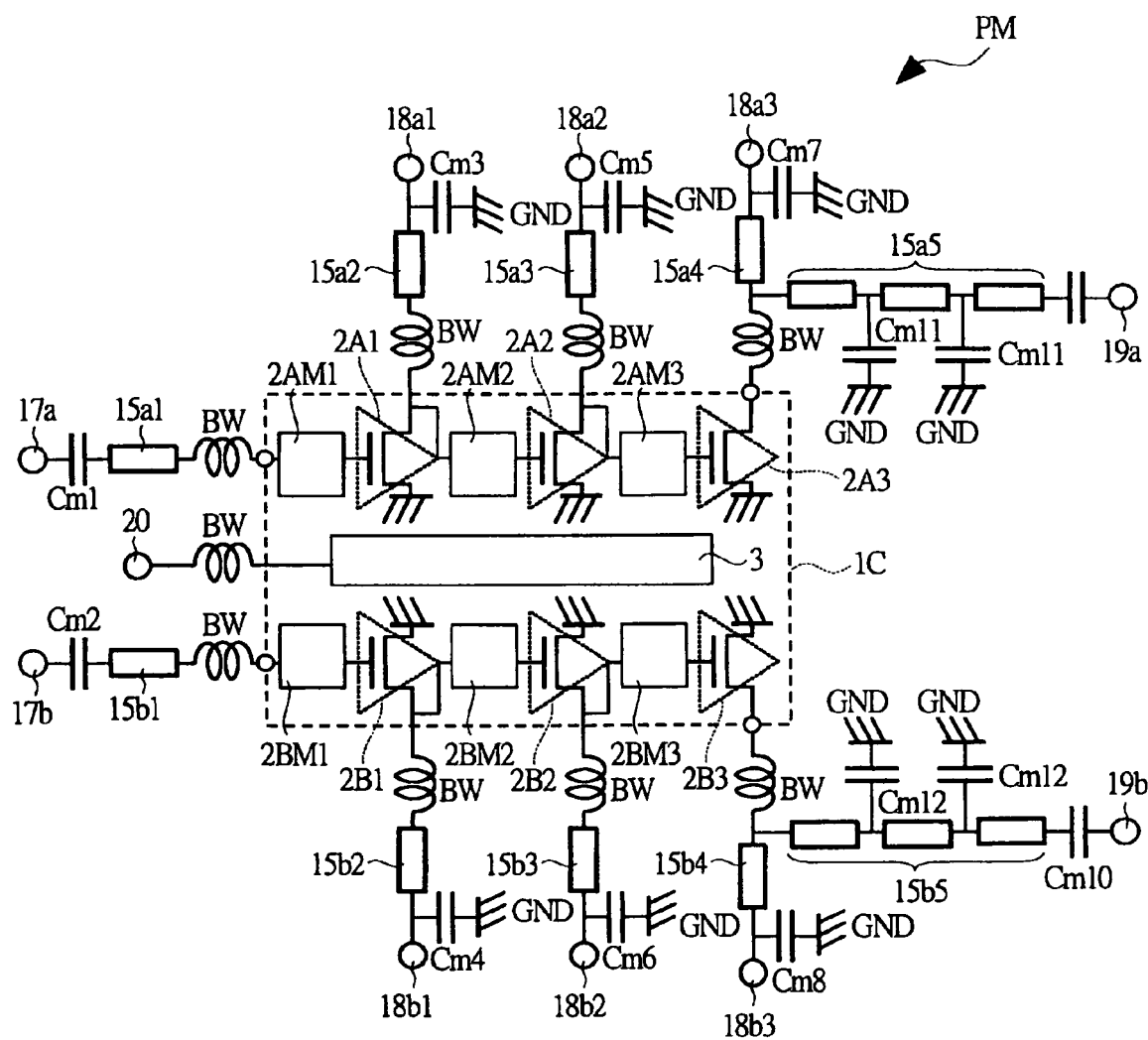
FIG. 10 is a circuit diagram illustrating an equivalent circuit of the RF power module shown in FIG. 8.

Next, FIG. 8 shows an overall plan view of an example of an RF power module PM in which the IC chip 1C may be mounted on a module board MCB. FIG. 9 is a cross-sectional view of a surface cut along the horizontal direction of the power module PM shown in FIG. 8. FIG. 10 shows a circuit diagram of the power module shown in FIGS. 8 and 9. Incidentally, the chip mounting surface of the module board MCB is shown in FIG. 8 so as to be brought into sight with an encapsulating member being eliminated therefrom.

The IC chip 1C may be mounted over a main surface of the module board MCB in a state of being held in a recess called "cavity CBT" formed over the main surface of the module board MCB in a state in which the back surface of the substrate 1S may be being directed to the main surface of the module board MCB. The IC chip 1C may be placed slightly near the input (left side in FIG. 8) as viewed from the center of the main surface of the module board MCB. A region on the output side of the main surface of the module board MCB may be wider than a region on the input side thereof. Thus, since an output matching circuit placed in the module board MCB of the RF power module PM may be designed to a low loss, the output loss of the RF power module PM may be lessened and hence a high output may be fetched out.

Bonding pads Pin and Pout of the IC chip 1C are electrically connected to transmission lines 15*a* (15*a*1 through 15*a*5), 15*b* (15*b*1 through 15*b*5) and 15*c* over the main surface of the module board MCB through bonding wires BW. The transmission lines 15*a*1 and 15*b*1 connected via the bonding wires BW to their corresponding gate electrodes (inputs) of the amplifying stages 2A1 and 2B1, corresponding to the first stage may be electrically connected to their corresponding input terminals 17*a* and 17*b* via capacitors Cm1 and Cm2. The transmission lines 15*a*2 and 15*b*2 electrically connected via the bonding wires BW to their corresponding drains (outputs) of the amplifying stages 2A1 and 2B1, each corresponding to the first stage may be electrically connected to their corresponding power supply terminals 18*a*1 and 18*b*1 on the high potential side, and may be electrically connected to a ground potential GND via capacitors Cm3 and Cm4 placed in the vicinity of the power supply terminals 18*a*1 and 18*b*1. The transmission lines 15*a*3 and 15*b*3 electrically connected via the bonding wires BW to their corresponding drains (outputs) of the amplifying stages 2A2 and 2B2, each corresponding to the second stage may be electrically connected to their corresponding power supply terminals 18*a*2 and 18*b*2 on the high potential side and electrically connected to the ground potential GND via capacitors Cm5 and Cm6 disposed in the neighborhood of the power supply terminals 18*a*2 and 18*b*2. The transmission lines 15*a*4 and 15*b*4 electrically connected via the bonding wires BW to their corresponding drains (outputs) of the amplifying stages 2A3 and 2B3 each corresponding to the final stage may be electrically connected to their corresponding power supply terminals 18*a*3 and 18*b*3 on the high potential side and electrically connected to the ground potential GND via capacitors Cm7 and Cm8 placed in the vicinity of the power supply terminals 18*a*3 and 18*b*3. Further, the transmission lines 15*a*5 and 15*b*5 electrically connected via the bonding wires BW to their corresponding drains (outputs) of the amplifying stages 2A3 and 2B3 each corresponding to the final stage may be electrically connected to their corresponding output terminals 19*a* and 19*b* via capacitors Cm9 and Cm10, and may be electrically connected to the ground potential GND via capacitors Cm11 and Cm12 placed in the middle of their lines. The transmission line 15*c* electrically connected to its corresponding control bonding pad Pin of the peripheral circuit 3 via a bonding wire may be electrically connected to a control terminal 20. Incidentally, each of the bonding wires BW may be constituted of a thin line, such as gold (Au), and functions as an inductor. Also the transmission lines 15*a* and 15*b*, respectively, may function as impedance matching inductors. The capacitors Cm1 through Cm12 may function as impedance matching capacitors and may be configured as chip parts.

On the other hand, the electrode 12 over the back surface of the IC chip 1C may be bonded to a chip mounting electrode 21 at the bottom face of the cavity CBT of the module board MCB. Electrode 21 may be electrically and thermally bonded to an electrode 23G over the back surface of the module board MCB via conductors lying within a plurality of thermal vias 22. The electrode 23G may be supplied with a reference potential (e.g., ground potential GND, i.e., about 0V). That is, the reference potential supplied to the electrode 23G over the back surface of the module board MCB may be supplied to the low resistance substrate 1S through the thermal vias 22 and the electrode 21. However, heat generated upon the operation of the IC chip 1C may be transferred via the electrode 21 and the thermal vias 22 from the back surface of the substrate 1S to the electrode 23G placed over the back surface of the module board MCB, from which the heat may be dissipated. Electrodes 23S located near the outer periphery of the back surface of the module board MCB may indicate signal electrodes. Incidentally, the module board MCB may have a multi-layered wiring structure formed by laminating a plurality of insulator plates and integrating them. Although the insulator plates may be respectively made of ceramics, such as alumina (aluminum oxide: $Al_2O_3$ and dielectric constant=9 to 9.7) low in dielectric loss up to, for example, a millimeter wave region, the present invention is not limited to it. Various changes may be made thereto and a glass epoxy resin or the like may be used.

Figure 11:
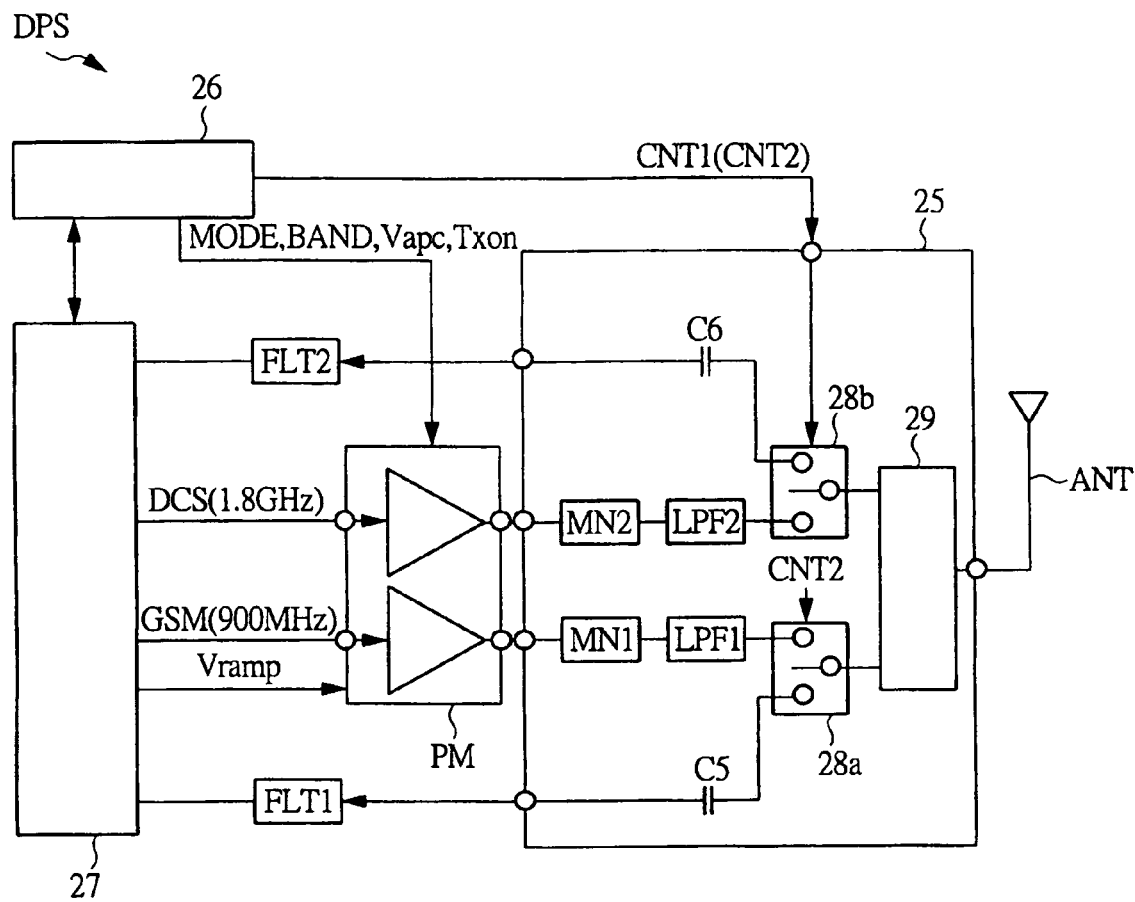
FIG. 11 is an explanatory view showing one example of a digital cellular phone system using the RF power module shown in FIG. 8.

As seen in FIG. 11, an example of a digital cellular phone system DPS using the RF power module PM according to the present invention is shown. Sign ANT in FIG. 11 may indicate a signal wave transmitting/receiving antenna; reference numeral 25 may indicate a frontend module; reference numeral 26 may indicate the baseband circuit, which may convert a voice or audio signal to a baseband signal, may convert a receive signal to an audio signal and may generate a modulation scheme switching signal and a baseband switching signal; reference numeral 27 may indicate a modulator-demodulator, which may down-convert the receive signal to demodulate it, thereby generating a baseband signal and may modulate a transmit signal; and FLT1 and FLT2 may indicate filters which may eliminate noise and an interference wave from the receive signal, respectively. The filter FLT1 may be used for GSM and the filter FLT2 may be used for DCS. The baseband circuit 26 may include of a plurality of semiconductor integrated circuits, such as a DSP (Digital Signal Processor), a microprocessor, a semiconductor memory, etc., for example. The frontend module 25 may include impedance matching circuits MN1 and MN2, low pass filters LPF1 and LPF2, switch circuits 28*a* and 28*b*, capacitors C5 and C6 and a duplexer 29. The impedance matching circuits MN1 and MN2 may be circuits that are connected to transmission output terminals of the RF power module PM to perform impedance matching. The low pass filters LPF1 and LPF2 may be circuits which attenuate higher harmonics; the switch circuits 28*a* and 28*b* may be transmission/reception changeover switch circuits; the capacitors C5 and C6 may be elements which cut dc components from the receive signal, and the duplexer 29 may be a circuit which perform branching into a signal lying in the GSM900 band and a signal lying in the DCS1800 band. These circuits and elements may be mounted on one wiring board so as to be configured as a module. Incidentally, select or changeover signals CNT1 and CNT2 of the switch circuits 28*a* and 28*b* may be supplied from the baseband circuit 26.

Figure 12:
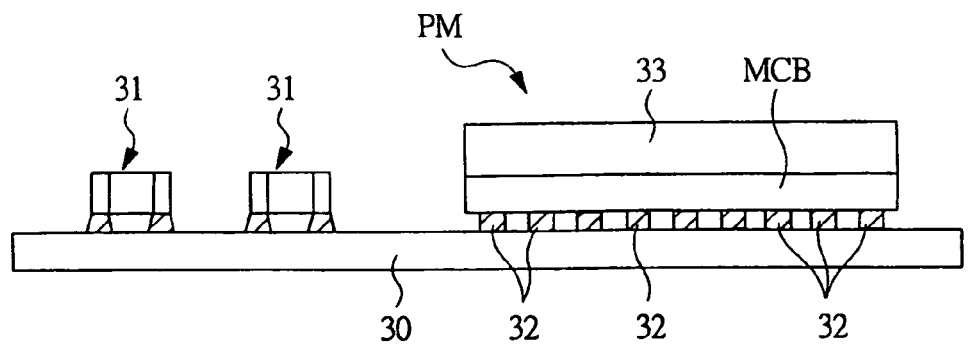
FIG. 12 is a fragmentary side view illustrating a packaged example of the RF power module of the digital cellular phone system shown in FIG. 11.

As seen in FIG. 12, a packaged example of the RF power module employed in the digital cellular phone system DPS shown in FIG. 11 is shown. The motherboard 30 may comprise, for example, a printed wiring board, or the like, having a multi-layered wiring structure. The RF power module PM and a plurality of chip parts 31 may be mounted over a main surface of the motherboard 30. The RF power module PM may be mounted over the motherboard 30 in a state in which the electrodes 23G and 23S, and the like, placed over the back surface of the module board MCB may be being directed to the main surface of the motherboard 30. The electrodes 23G and 23S, and the like, of the RF power module PM may be connected to their corresponding wiring patterns of the motherboard 30 via jointing materials 32, such as solder, for example. Incidentally, the main surface of the mother board MCB of the RF power module PM may be covered with an encapsulating member 33 made of, for example, silicon rubber, or the like. Thus, the IC chip 1C and the like placed over the main surface of the module board MCB may be sealed with the encapsulating member 33.

In another exemplary embodiment of the present invention, ground bonding pads may be laid out among output bonding pads of adjacent amplifying stages in the same system of an IC chip.

Figure 13:
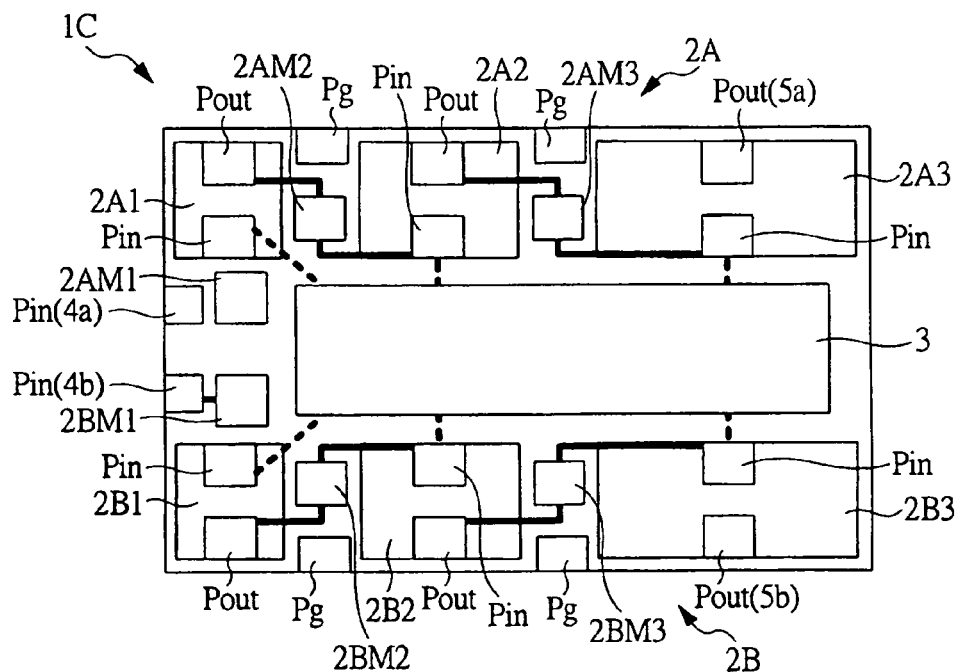
FIG. 13 is an overall plan view of a semiconductor chip, showing a circuit layout example of a semiconductor device according to another exemplary embodiment of the present invention.

As seen in FIG. 13, one example of an overall plan view of the IC chip 1C according to the present embodiment is shown. In the present embodiment, ground bonding pads Pg may be disposed among output bonding pads Pout of a plurality of adjacent amplifying stages 2A1 through 2A3 and 2B1 through 2B3 in respective power amplifier circuits 2A and 2B provided within the IC chip 1C. The ground bonding pads Pg may be pads which supply a reference potential (e.g., ground potential GND: 0V) to the IC chip 1C. Thus, since the feedback of a signal by emission from a next-stage amplifying element to a pre-stage amplifying element after signal amplification may be lessened, the suppression of oscillations and stabilization of amplifying characteristics may be achieved.

Figure 14:
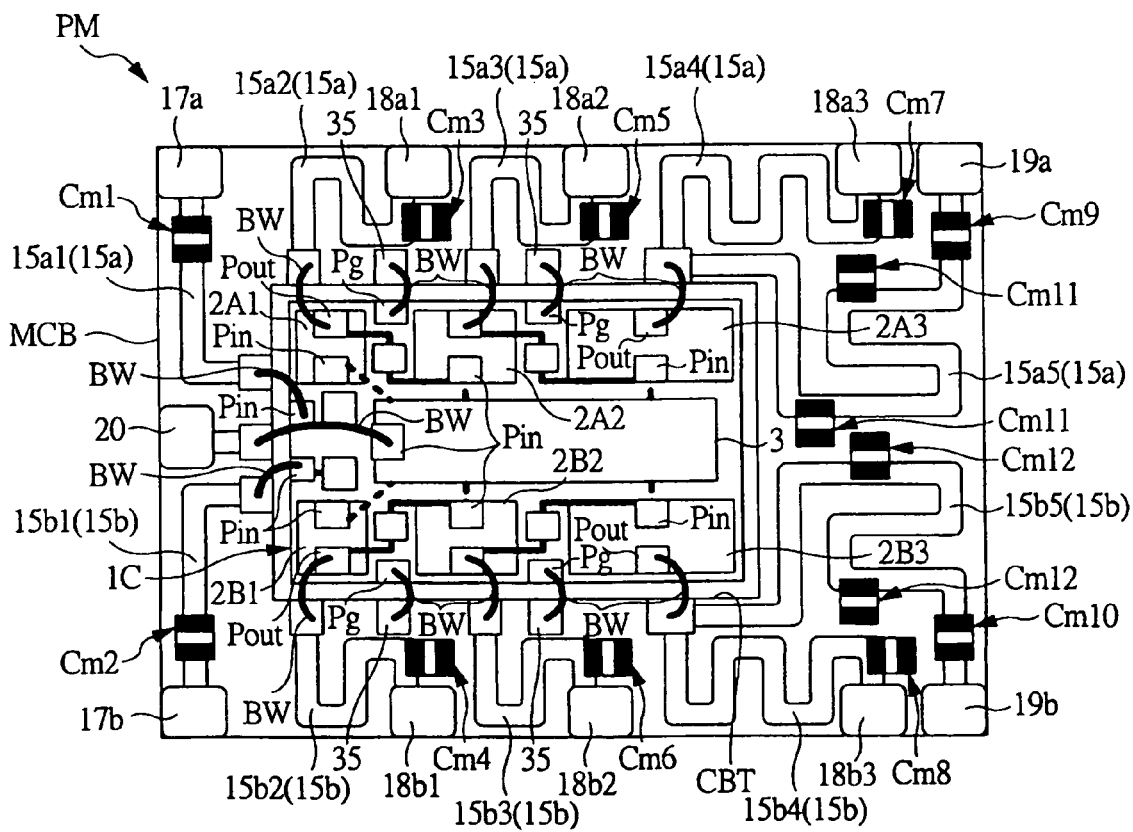
FIG. 14 is an overall plan view illustrating one example of an RF power module in which the semiconductor chip shown in FIG. 13 is mounted on a module board.

As seen in FIG. 14, an overall plan view of one example in which the IC chip 1C shown in FIG. 13 may be mounted over a module board MCB to configure an RF power module PM is shown. A chip mounting surface of the module board MCB may be shown so as to be brought into sight with an encapsulating member being eliminated therefrom. The ground bonding pads Pg may be electrically connected to their corresponding ground terminals 35 of the module board MCB through bonding wires BW. The reference potential (e.g., ground potential GND: 0V) may be supplied to the ground terminals 35. Owing to the provision of such a configuration, power radiated into space upon the operation of the RF power module PM may be absorbed by the bonding wires BW each electrically connected to the bonding pad Pg and may be brought to the ground state, so that the power may be greatly attenuated. Therefore, it may be possible to achieve suppression of oscillations and stabilization of amplifying characteristics.

In yet another exemplary embodiment of the present invention, a modification illustrative of the layout of input and output bonding pads of adjacent amplifying stages in the same system of air IC chip may be made.

Figure 15:
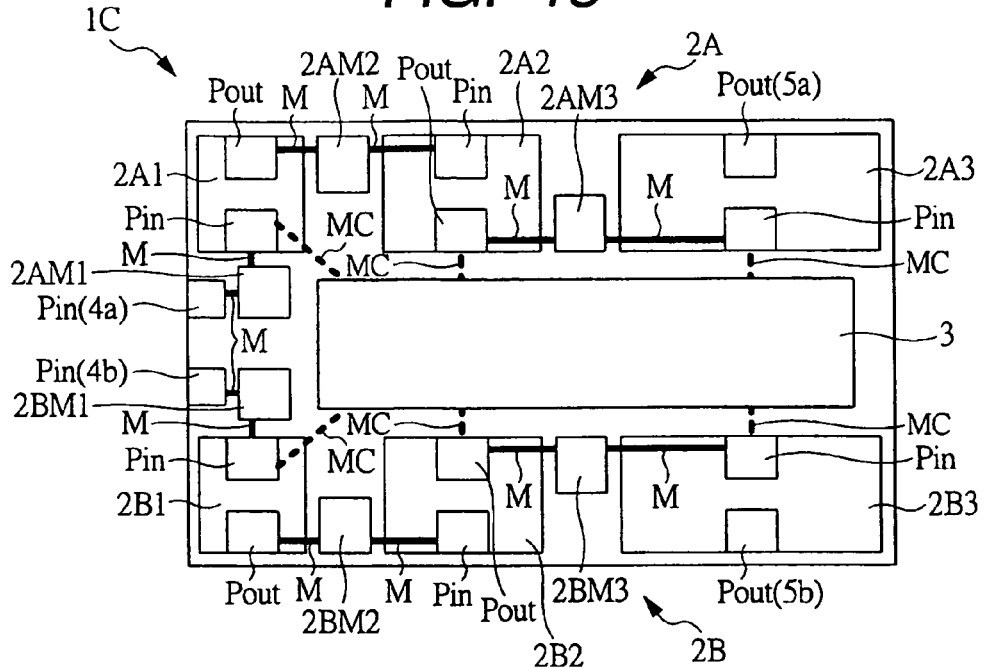
FIG. 15 is an overall plan view of a semiconductor chip, showing a circuit layout example of a semiconductor device according to a further exemplary embodiment of the present invention.

As seen in FIG. 15, an overall plan view of the IC chip according to the present invention is shown. In an exemplary embodiment, input and output bonding pads Pin and Pout of a plurality of adjacent amplifying stages 2A1 through 2A3 and 2B1 through 2B3 may be laid out in respective power amplifier circuits 2A and 2B lying within the IC chip 1C so as to be reversed by 180°. In the example shown in FIG. 15, the output bonding pads Pout of the amplifying stages 2A2 and 2B2, each corresponding to a second stage, may be disposed near the center of the IC chip 1C, and the input bonding pads Pin thereof may be laid out in the neighborhood of the sides of the IC chip 1C. In such a configuration, interstage wirings M for connecting the input bonding pads Pin of the amplifying stages 2A1 through 2A3 and 2B1 through 2B3 adjacent to one another and the output bonding pads Pout thereof may extend substantially linearly without bending. In such a configuration, the interstage wirings M may be shortened, and the interstage wirings M and interstage matching circuits 2AM2, 2AM3, 2BM2 and 2BM3 may be located away from the output bonding pads Pout of the next-stage amplifying stages as compared with exemplary embodiments described herein. Therefore, it may be possible to reduce crosstalk from the next-stage amplifying stages to the interstage wirings M and the interstage matching circuits 2AM2, 2AM3, 2BM2 and 2BM3. Thus, it may be possible to achieve suppression of oscillations and stability of amplifying characteristics.

Figure 16:
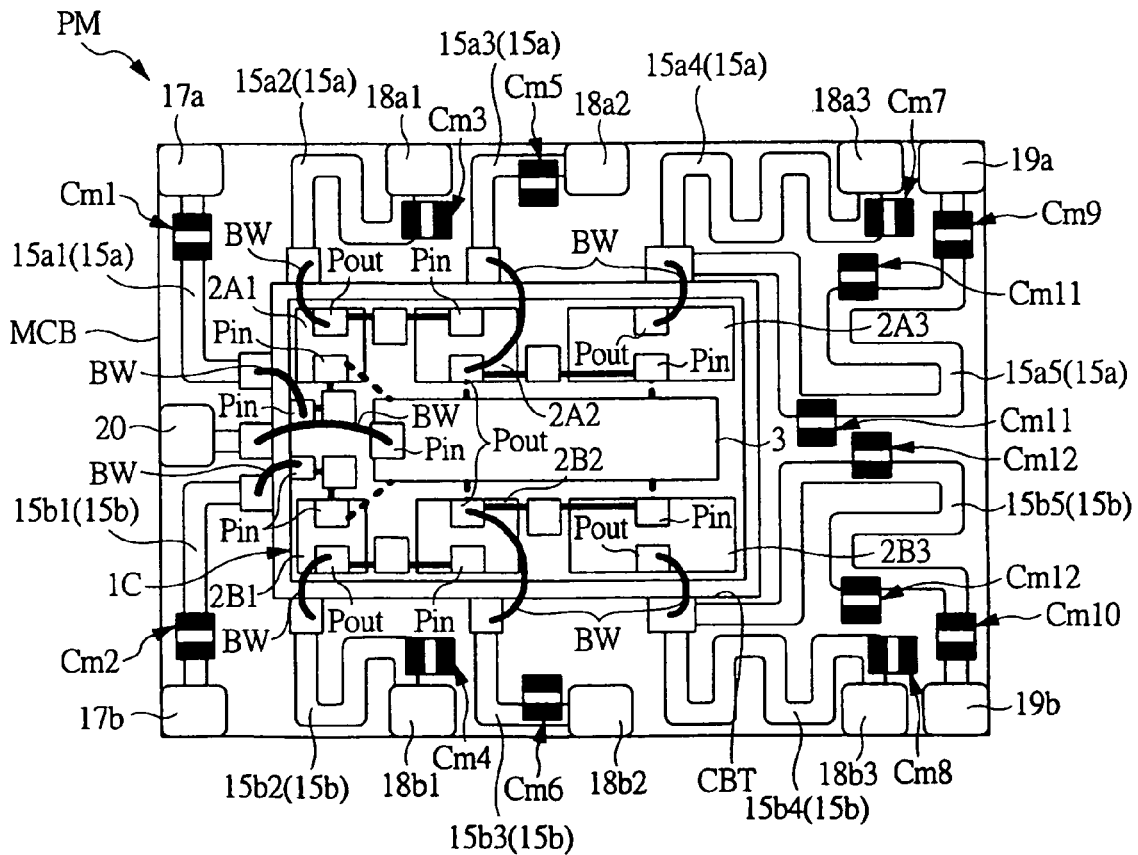
FIG. 16 is an overall plan view illustrating one example of an RF power module in which the semiconductor chip shown in FIG. 15 is mounted on a module board.

As seen in FIG. 16, an overall plan view of an aspect of the present invention is shown, in which the IC chip 1C shown in FIG. 15 may be mounted over a module board MCB to configure an RF power module PM. In FIG. 16, a chip mounting surface of the module board MCB may be shown so as to be brought into sight with an encapsulating member being eliminated therefrom. Since the output bonding pads Pout of the amplifying stages 2A2 and 2B2, each corresponding to the second stage may be placed near the center of the IC chip 1C in the present embodiment as described above, the lengths of power supply bonding wires BW for connecting the output bonding pads Pout of the amplifying stages 2A2 and 2B2, each corresponding to the second stage, and power supply transmission lines 15*a*3 and 15*b*3 of the module board MCB, may be set longer than those of other bonding wires BW. Therefore, inductance components for power lines to the amplifying stages 2A2 and 2B2, each corresponding to the second stage, may be increased by means of the bonding wires BW. Also, the lengths of the power supply transmission lines 15a3 and 15b3 placed over the module board MCB may be shortened as compared with other exemplary embodiments described herein. Thus, a reduction in the overall size of the RF power module PM may be promoted.

Figure 17:
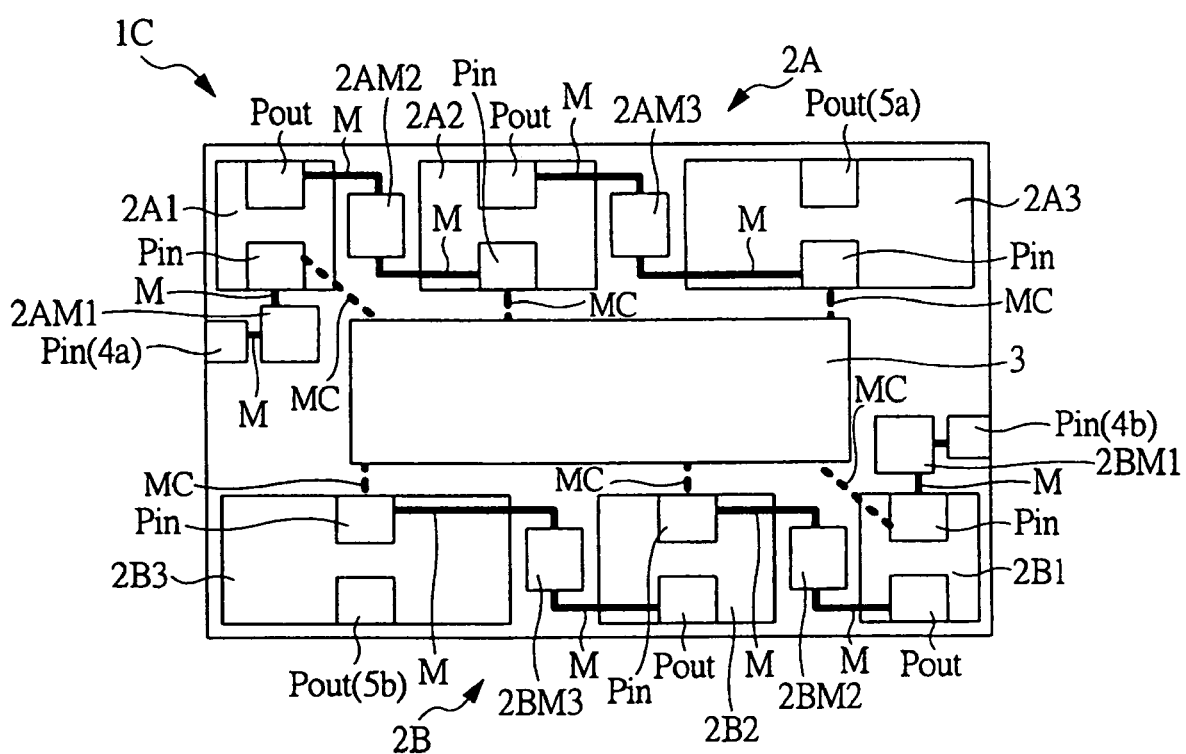
FIG. 17 is an overall plan view of a semiconductor chip, showing a circuit layout example of a semiconductor device according to yet another exemplary embodiment of the present invention.

In another exemplary embodiment of the present invention, the layouts of power amplifier circuits in different systems of an IC chip may be opposite in direction to each other. As may be seen in FIG. 17, an overall plan view of an IC chip 1C according to the present invention is shown. In the present exemplary embodiment, power amplifier circuits 2A and 2B in different systems provided within an IC chip 1C may be disposed so as to be opposite in input/output direction to each other. In particular, amplifying stages 2A3 and 2B3, each corresponding to a final stage of the power amplifier circuits 2A and 2B of the different systems, may be disposed in the vicinity of diagonally-located ends of the IC chip 1C so as to be point-symmetric with each other. Thus, since the distance between the final amplifying stages 2A3 and 2B3 of the power amplifier circuits 2A and 2B of the different systems may be made long, crosstalk (emission or interference) from, for example, the operated power amplifier circuit to the non-operated power amplifier circuit, may be suppressed in a manner similar to previously described exemplary embodiments, and the unnecessary occurrence of an output from the power amplifier circuit being in non-operation may be suppressed. Even if the power amplifier circuits 2A and 2B different in system are provided in the same IC chip 1C, the crossband isolation characteristic between the power amplifier circuits 2A and 2B may be improved.

Although the exemplary embodiments described herein have explained the case in which the present invention may be applied to the dual band system capable of handling the radio waves lying in the two frequency bands of GSM900 and GSM1800, the present invention may also be applied to a triple band system capable of handling radio waves lying in three frequency bands of GSM900, GSM1800 and GSM1900, for example. Also, the present invention may additionally handle an 800 MHz band and an 850 MHz band.

Although the above description has principally been described as applied to digital cellular phone systems, the present invention may also be applied to, for example, a mobile information processing apparatus, such as PDA (Personal Digital Assistants), or the like, having a communication function and an information processing apparatus similar to a personal computer, or the like, having a communication function. Further, the semiconductor device according to the present invention may be further applied to a semiconductor device having power amplifier circuits of plural systems.

Those of ordinary skill in the art may recognize that many modifications and variations of the present invention may be implemented without departing from the spirit or scope of the invention. Thus, it is intended that the present invention covers the modifications and variations of this invention provided they come within the scope of the appended claims and their equivalents.

What is claimed is:

1. A semiconductor device, comprising:
   a plurality of power amplifier circuits configured in a multistage-connected form,
   wherein a first to a final stage of the plurality of amplifier circuits are formed over one semiconductor substrate of silicon,
   wherein the plurality of amplifier circuits comprise field effect transistors,
   wherein drain and source electrodes of the field effect transistors are respectively formed over a main surface and a back surface of the semiconductor substrate,
   wherein the respective source electrodes of the plurality of field effect transistors are electrically connected to one another at the back surface of the semiconductor substrate,
   wherein the respective source electrodes are connected to a fixed potential, and
   wherein resistivity of the semiconductor substrate constituted of the silicon is in a range of about 1 mΩ·cm to about 10 mΩ·cm.

2. A semiconductor device according to claim 1, wherein the power amplifier circuits operate in one bandwidth of an 800 MHz band, a 900 MHz band, an 1800 MHz band and a 1900 MHz band.

3. A semiconductor device according to claim 1, wherein the semiconductor substrate is mounted over a wiring board, and the sources of the field effect transistors are respectively electrically connected to a fixed potential of the wiring board.

4. A semiconductor device according to claim 1, wherein the semiconductor substrate is provided with passive elements for matching circuits.

5. A semiconductor device according to claim 4, wherein the semiconductor substrate is mounted over a wiring board and provided with input and output matching circuits for each of the amplifier circuits.

6. A semiconductor device according to claim 4, wherein shield layers are provided around the passive elements for the matching circuits, and wherein the shield layers are electrically connected to the semiconductor substrate through semiconductor regions and electrically connected to a fixed potential via an electrode over the back surface of the semiconductor substrate.

7. A semiconductor device according to claim 1, wherein the semiconductor substrate is provided with a bias circuit and a control circuit used for the amplifier circuits.

8. A semiconductor device according to claim 1, wherein a multiband system capable of coping with high frequency signals lying in a plurality of frequency bands is adopted for the semiconductor device.

9. A semiconductor device according to claim 1, wherein the amplifier circuits respectively comprise three amplifying stages.

10. A semiconductor device, comprising:
   first and second power amplifier circuits differing in operating frequency, which respectively comprise a plurality of amplifier circuits configured in a multistage-connected form; and
   passive elements for matching circuits employed in the first and second power amplifier circuits and a bias circuit and a control circuit,
   wherein a first to a final stage of the plurality of amplifier circuits of the first and second power amplifier circuits are formed over one silicon semiconductor substrate,
   wherein the plurality of amplifier circuits respectively comprise field effect transistors, wherein drain and source electrodes of the field effect transistors are respectively formed over a main surface and a back surface of the semiconductor substrate, wherein the respective source electrodes of the plurality of field effect transistors are electrically connected to one another in the back surface of the semiconductor substrate, wherein the source electrodes are respectively connected to a fixed potential, and wherein resistivity of the semiconductor substrate is in a range of about 1 mΩ·cm to about 10 mΩ·cm.

* * * * *